(12) United States Patent
Birk et al.

(10) Patent No.: US 8,604,862 B2
(45) Date of Patent: Dec. 10, 2013

(54) FOUR-QUADRANT BOOTSTRAPPED SWITCH CIRCUIT

(75) Inventors: Christian Steffen Birk, Innishannon (IE); Gerard Mora Puchalt, Catarroja (ES)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/546,802

(22) Filed: Jul. 11, 2012

(65) Prior Publication Data

US 2013/0009623 A1      Jan. 10, 2013

Related U.S. Application Data

(63) Continuation-in-part of application No. 13/099,164, filed on May 2, 2011, now Pat. No. 8,222,948, which is a continuation of application No. 12/619,068, filed on Nov. 16, 2009, now Pat. No. 7,952,419.

(60) Provisional application No. 61/531,210, filed on Sep. 6, 2011, provisional application No. 61/532,880, filed on Sep. 9, 2011.

(51) Int. Cl.
   *H03K 17/16*      (2006.01)
(52) U.S. Cl.
   USPC .......................................... 327/390; 327/589
(58) Field of Classification Search
   USPC ................... 327/427, 434, 390, 589
   See application file for complete search history.

(56) References Cited

U.S. PATENT DOCUMENTS

| | | | |
|---|---|---|---|
| 4,395,643 A | | 7/1983 | Lehmann |
| 4,985,703 A | * | 1/1991 | Kaneyama ................... 341/141 |
| 5,138,200 A | | 8/1992 | Barsanti et al. |
| 5,350,957 A | * | 9/1994 | Cooper et al. ................ 327/427 |
| 5,406,222 A | | 4/1995 | Brokaw |
| 5,500,612 A | | 3/1996 | Sauer |
| 5,717,356 A | | 2/1998 | Kohama |
| 6,069,503 A | | 5/2000 | Doyle |
| 6,400,616 B1 | | 6/2002 | Tamura et al. |
| 6,426,614 B1 | | 7/2002 | Guthrie |
| 6,496,072 B2 | | 12/2002 | Cho et al. |
| 6,873,200 B2 | | 3/2005 | Evers et al. |
| 6,911,860 B1 | * | 6/2005 | Wang et al. ................... 327/404 |

(Continued)

OTHER PUBLICATIONS

J. Steensgaard, "Bootstrapped Low-Voltage Analog Switches," IEEE International Symposium on Circuits and Systems, vol. 2, pp. 29-32, 1999.

(Continued)

*Primary Examiner* — Kenneth B. Wells
(74) *Attorney, Agent, or Firm* — Kenyon & Kenyon LLP (57) ABSTRACT

A bootstrapped switch circuit includes a first switch transistor to receive an input signal and a second switch transistor to provide an output signal. The sources of the switch transistors may be coupled. A voltage source may be coupled to the sources of the switch transistors and at least one of the gates of the switch transistors. The voltage source may generate a control voltage to activate at least one of the switch transistors based on a bias current. A voltage source driver may be coupled to the voltage source to generate the bias current based on a bias voltage. The bias voltage may include a first voltage approximately corresponding to an overdrive voltage of at least one of the switch transistors and a second voltage approximately corresponding to a threshold voltage of the switch transistors.

7 Claims, 5 Drawing Sheets

(56) References Cited

U.S. PATENT DOCUMENTS

| | | |
|---|---|---|
| 6,943,786 B1 | 9/2005 | Birk et al. |
| 7,026,858 B2 * | 4/2006 | Tosaka ............... 327/427 |
| 7,176,742 B2 | 2/2007 | Aksin et al. |
| 7,183,814 B2 | 2/2007 | Kudo |
| 7,397,284 B1 | 7/2008 | Liu |
| 7,408,396 B2 | 8/2008 | El-Khoury et al. |
| 7,679,417 B2 * | 3/2010 | Vice ............... 327/308 |
| 7,928,794 B2 | 4/2011 | Balboni |
| 7,982,521 B2 * | 7/2011 | Zmora et al. ............... 327/310 |
| 2006/0202735 A1 | 9/2006 | Aksin et al. |
| 2006/0202742 A1 | 9/2006 | Aksin et al. |
| 2006/0244498 A1 | 11/2006 | Kohout et al. |
| 2011/0050317 A1 | 3/2011 | Nonaka |
| 2011/0115544 A1 | 5/2011 | Birk |

OTHER PUBLICATIONS

International Search Report and Written Opinion of the International Searching Authority in counterpart International Application No. PCT/US2012/051915, report dated Nov. 20, 2012.

* cited by examiner

FOUR-QUADRANT BOOTSTRAPPED SWITCH CIRCUIT

PRIORITY CLAIM

The present application claims priority to U.S. Provisional Application No. 61/531,210, filed on Sep. 6, 2011 and to U.S. Provisional Application No. 61/532,880, filed on Sep. 9, 2011, the entirety of which are incorporated by reference herein.

The present application is a continuation-in-part of U.S. patent application Ser. No. 13/099,164, filed on May 2, 2011, now U.S. Pat. No. 8,222,948, which is a continuation of U.S. patent application Ser. No. 12/619,068, filed on Nov. 16, 2009, now U.S. Pat. No. 7,952,419, the entirety of which are incorporated by reference herein.

BACKGROUND

1. Field of the Invention

The present invention generally relates to the configuration and control of switch circuits. More specifically, the present invention provides improved control of switch circuits to enhance switch performance metrics.

2. Background Art

Switches can be used to provide or restrict an electrical path between terminals. Switches can be implemented using transistors in a variety of applications including digital electronics, logic gate circuits, and control of high power devices such as motors. As an example, a single transistor can be used to generate a low impedance or a high impedance between the source and the drain of the transistor in response to an applied control signal. However, the control signals that are applied to the transistor can cause the switch to leak currents. For example, as the source of the transistor increases to a higher potential than the drain, a forward biased body diode, caused by the junction formed between the back gate and the drain, can allow current to flow from the source and the back gate terminal to the drain terminal, thereby degrading performance of the switch.

This current path caused by the body diode can be avoided by placing a second transistor back-to-back with the first transistor. In this arrangement, the sources of the transistors can be coupled together and the gates of the transistors can be coupled together. The back-to-back transistor arrangement may block the current path caused by the body diode in both directions. However, even with this arrangement, the applied control signal can still change various parameters of the switch in a destructive manner. Accordingly, what is needed are improved switch control mechanisms that do not degrade switch performance metrics.

BRIEF DESCRIPTION OF THE DRAWINGS

The accompanying drawings illustrate the present invention and, together with the description, further serve to explain the principles of the invention and to enable one skilled in the pertinent art to make and use the invention.

DETAILED DESCRIPTION

Aspects of the present invention provide improved switch configuration and improved control of switches to enhance switch performance parameters. According to the present invention, a switch circuit may include a first switch transistor to receive an input signal and a second switch transistor to provide an output signal. The switch circuit may be configured as a four-quadrant bootstrapped switch circuit having the sources of the first and second switch transistors coupled together. The gates of the first and second switch transistors may also be coupled.

The bootstrapped switch circuit may include a voltage source coupled to at least one of the gates of the first and second switch transistors and coupled to the sources of the first and second switch transistors. The voltage source may generate a control voltage to activate at least one of the first and second switch transistors based on a received bias current. The bootstrapped switch circuit may also include a voltage source driver coupled to the voltage source. The voltage source driver may generate the bias current based on a bias voltage. The bias voltage may include a first voltage approximately corresponding to an overdrive voltage of at least one of the first and second switch transistors and a second voltage approximately corresponding to a threshold voltage of the first and second switch transistors.

Additionally or alternatively, the bias voltage in the voltage source driver may be generated by applying a current to a circuit element having an approximately constant resistance.

Additionally or alternatively, the first and second switch transistors may be coupled to a voltage source that generates a first control voltage to turn on the first and second switch transistors and a second control voltage to turn off the first and second switch transistors. The voltage source may generate the first control voltage by summing a gate-to-source voltage of a first transistor and a voltage across a circuit element when a first bias current is applied to the first transistor and the circuit element. The voltage source may generate the second control voltage that corresponds approximately to a negative value of a gate-to-source voltage of a second transistor that is generated when a second bias current is applied to the second transistor.

Figure 1:
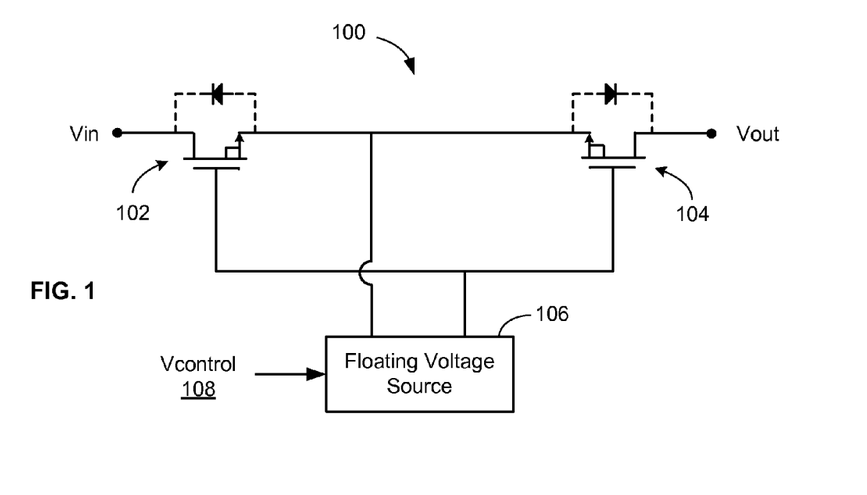
FIG. 1 is a circuit schematic depicting an exemplary embodiment of a bootstrapped switch circuit.

FIG. 1 is a circuit schematic depicting an exemplary embodiment of a bootstrapped switch circuit 100. As shown in FIG. 1, the bootstrapped switch circuit 100 may include a transistor 102, a transistor 104, a floating voltage source 106 and a control signal Vcontrol 108. The transistors 102 and 104 can be NMOS transistors, but are not so limited. As shown in FIG. 1, the transistors 102 and 104 can have their back gates inherently connected to their sources, but are not so limited. The transistors 102 and 104 are illustrated with diodes shown in phantom to depict the biasing that can allow current to flow from the source/back gate terminal to the drain terminal of each of the transistors 102 and 104. Specifically, when the sources of the transistors 102 and 104 are at a higher potential than their respective drains, the body diode (PN junction formed by the back gate and the drain) can be forward biased, allowing current to flow from the source/back gate terminals to the drain terminals.

As shown in FIG. 1, the drain of the NMOS transistor 102 can be configured to be an input terminal and the drain of the NMOS transistor 104 can be configured to be an output terminal. The drain of the NMOS transistor 102 can receive input signal Vin and the drain of the NMOS transistor 104 can provide output signal Vout. The gates of the NMOS transistors 102 and 104 may be coupled to each other. Similarly, the sources of the NMOS transistors 102 and 104 can be coupled to each other. The floating voltage source 106 may be coupled between the connected sources and connected gates of the NMOS transistors 102 and 104. Specifically, a first terminal of the floating voltage source 106 can be coupled to the gates of the NMOS transistors 102 and 104 and a second terminal of the floating voltage source 106 can be coupled to the sources of the NMOS transistors 102 and 104.

The floating voltage source 106 can be configured to provide one or more predetermined (approximately) constant gate-to-source voltages Vgs to the NMOS transistors 102 and 104. A predetermined constant gate-to-source voltage Vgs can be provided in response to the control signal Vcontrol 108. To turn the bootstrapped switch circuit 100 on, the predetermined constant gate-to-source voltage Vgs supplied by the floating voltage source 106 can be large enough to turn the NMOS transistors 102 and 104 on. Specifically, the gate-to-source voltage Vgs applied can allow current to flow from the drain to the source and from the source to the drain of the NMOS transistors 102 and 104, respectively. To turn the bootstrapped switch circuit 100 off, the predetermined constant gate-to-source voltages Vgs supplied by the floating voltage source 106 can be below the required value to turn on the NMOS transistors 102 and 104. This gate-to-source voltage Vgs can be any value below the threshold voltage of the transistors 102 and 104, including but not limited to, zero volts or a negative voltage.

Thus, a first predetermined constant voltage Vgs1 can be supplied by the floating voltage source 106 to turn on the bootstrapped switch 100 and a second predetermined constant voltage Vgs2 can be supplied by the floating voltage source 106 to turn off the bootstrapped switch 100. Vgs1 can be, e.g., a positive voltage and Vgs2 can be zero or a negative voltage. When the bootstrapped switch 100 is on or activated, Vin applied to the drain of the transistor 102 can be provided to the drain of the transistor 104 as Vout. When the bootstrapped switch 100 is off, no signal will be allowed to flow between the drains of the transistors 102 and 104 (i.e., between Vin and Vout terminals).

The floating voltage source 106 can be configured to provide a first predetermined constant voltage Vgs1 which approximately equals or exceeds the voltage needed to turn the transistors 102 and 104 on. The first predetermined constant voltage Vgs1 can include two components. A first component can be a threshold voltage that is needed to turn on the bootstrapped switch 100. A second component can be an overdrive voltage that can be used to control various parameters of the bootstrapped switch 100. The overdrive voltage may be used to control switch parameters such as the on-resistance of the transistors. The two components may be summed by the floating voltage source 106.

The floating voltage source 106 can be configured to provide a second predetermined constant voltage Vgs2 which can be less than the voltage needed to turn the transistors 102 and 104 on. The floating voltage source 106 can be configured to change the magnitude and sign of the predetermined constant voltage Vgs. Thus, the floating voltage source 106 can be configured to provide a second predetermined constant voltage Vgs2 which can be zero or a negative value. Providing a second predetermined constant voltage Vgs2 which is negative may provide advantages such as reducing switch leakage.

As discussed herein, a predetermined constant gate-to-source voltage Vgs provided by the floating voltage source 106 can be approximately constant to within a degree that accounts for normal circuit operation variation due to temperature changes or noise. That is, the predetermined constant gate-to-source voltages Vgs can be constant in that they are DC voltage values, rather than AC voltage values. Further, the predetermined constant gate-to-source voltages Vgs can be considered as not having a time-varying component other than changing from the first value Vgs1 to the second value Vgs2 in response to a change in logic state of the control signal Vcontrol 108, for example.

Figure 2:
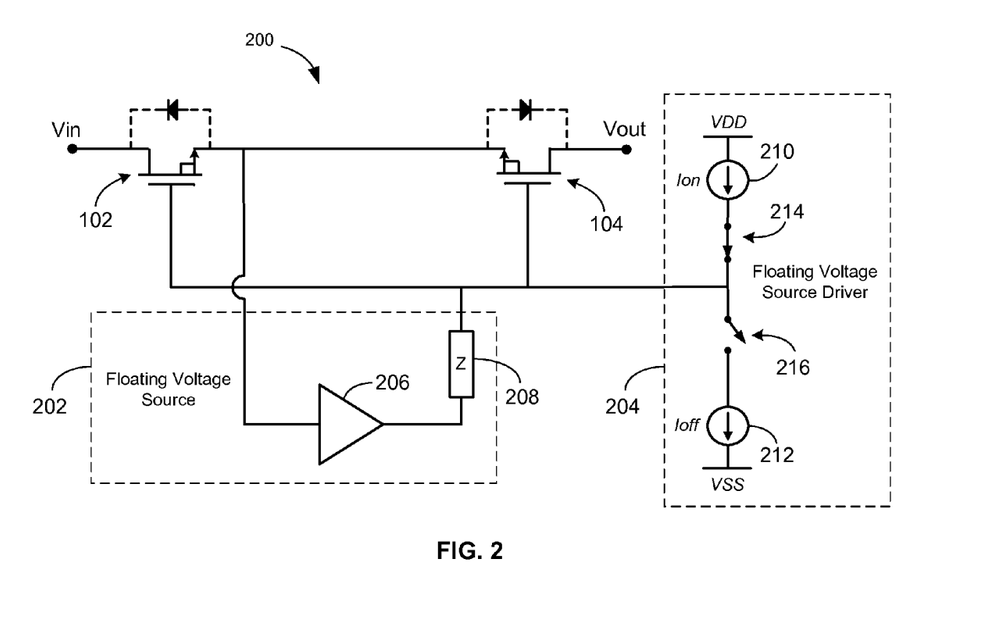
FIG. 2 is a circuit schematic depicting an exemplary embodiment of a bootstrapped switch circuit having a floating voltage source and a floating voltage source driver.

FIG. 2 is a circuit schematic depicting an exemplary embodiment of a bootstrapped switch circuit 200 having a floating voltage source 202 and a floating voltage source driver 204. The floating voltage source 202 can include a sensing component 206 (e.g., a buffer amplifier) and a circuit element 208. The floating voltage source driver 204 can include a first current source 210, a second current source 212, a first switch 214 and a second switch 216. The first current source 210 may be coupled to a first supply voltage VDD. The second current source 212 can be coupled to a second supply voltage VSS. The first supply voltage VDD can be a positive supply voltage and the second supply voltage VSS can be a negative supply voltage, a lowest negative supply voltage or a ground.

As shown in FIG. 2, a first terminal of the floating voltage source 202 can be coupled to the node connecting the sources of the transistors 102 and 104. A second terminal of the floating voltage source 202 can be coupled to the node connecting the gates of the transistors 102 and 104. The output of the floating voltage source driver 204 can be coupled to the node connecting the gates of the transistors 102 and 104. The floating voltage source driver 204 can be configured to apply a bias current (e.g., a positive or negative current) to a node of the floating voltage source 202. The value of the voltage provided by the floating voltage source 202 across its first and second terminals (i.e., Vgs) may depend on the current provided by the floating voltage source driver 204 (e.g., a positive or a negative voltage depending on the direction of the current flow). The magnitude of the voltage provided by the floating voltage source 202 may be a function of the magnitude of bias current provided by the floating voltage source driver 204.

The sensing component 206 can be coupled to the node connecting the sources of the transistors 102 and 104 and can be coupled to the circuit element 208. The circuit element 208 can be coupled to the sensing component 206 and to the node connecting the gates of the transistors 102 and 104 and can provide a voltage drop. The sensing component 206 and the circuit element 208 may be a single device or a combination of devices performing the operations of the sensing component 206 and the circuit element 208.

The sensing component can be, but is not limited to, a transistor, an amplifier, a unity gain amplifier or a buffer. The sensing component 206 may be implemented, for example, using at least one NMOS or PMOS transistor or any combination thereof, in a source follower configuration. As a specific example, the sensing component 206 may be realized by using a PMOS transistor that has its gate coupled to the node connecting the sources of the transistors 102 and 104, has its source coupled to the circuit element 208, and its drain coupled to a negative supply voltage, which may be a lowest negative supply voltage or ground. The sensing component 206 can sense the voltage to which the floating voltage source 202 is referred. The sensing component 206 can have a high input impedance to prevent overloading the node (sensing node) connecting the sources of the transistors 102 and 104. The sensing component 206, in addition to sensing the node connecting the sources of the transistors 102 and 104, can also generate a voltage drop across the sensing component 206. For example, if a PMOS transistor is used as the sensing component 206, the PMOS transistor may generate a voltage drop across it approximately equal to the gate-to-source voltage Vgs of the PMOS transistor.

Figure 3:
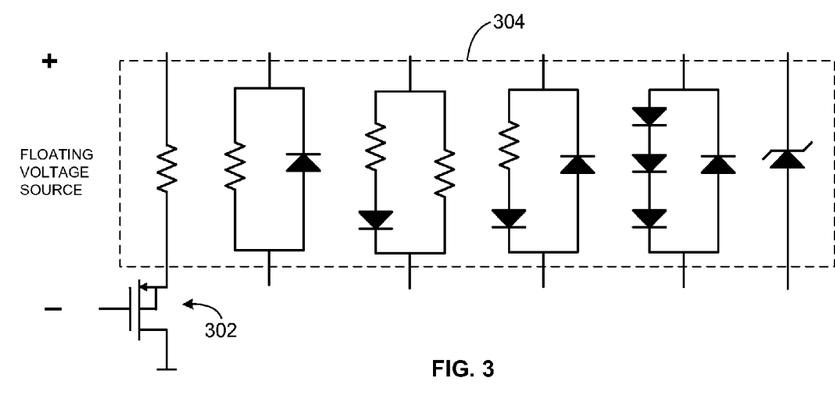
FIG. 3 is a circuit schematic depicting exemplary embodiments of circuit elements that can be used in the bootstrapped switch circuit depicted in FIG. 2.

The voltage drop generated by the floating voltage source 202 can include two components. A first component of the voltage drop can have a value corresponding to the voltage drop provided by the circuit element 208 and a second component can have a value corresponding to a voltage drop provided by the sensing component 206. The circuit element 208 may be a bidirectional circuit element. For example, FIG. 3 shows a sensing component 302 and examples of circuit elements 304 that can be used to provide the voltage drop in the bootstrapped switch circuit 200. The circuit elements 304 can take the form of any one or a combination of resistors, diodes, diode connected NMOS or PMOS transistors and zener diodes. Other elements can be used that replicate or approximate the functional behavior of a resistor to provide a desired voltage drop. In FIG. 3, the sensing component 302 can be implemented by a transistor.

The current sources 210 and 212 and the switches 214 and 216 can be arranged to provide an "on current" Ion supplied by the current source 210 and to provide an "off current" Ioff supplied by the current source 212. The switches 214 and 216 can control which current source (either the current source 214 or 216) supplies current to the floating voltage source 202. As shown in FIG. 2, when the switch 214 is in the on position (i.e., closed) and the switch 216 is in the off position (i.e., open), the current source 210 can supply current Ion to the floating voltage source 202. Under this scenario, the current source 210 provides the current Ion to the circuit element 208 to provide a first voltage drop across the circuit element 208 which can cause the bootstrapped switch 200 to be on (i.e., when the transistors 102 and 104 are on, current can flow between the source and the drain). When the switch 214 is in the off position (i.e., open) and the switch 216 is in the on position (i.e., closed), the current source 212 can supply current Ioff to the floating voltage source 202. Under this scenario, current source 212 provides the current Ioff to the circuit element 208 to provide a second voltage drop across circuit element 208. The second voltage drop can be of a value that causes the bootstrapped switch 200 to be off (i.e., when the transistors 102 and 104 are off, current can be prevented from flowing between the source and the drain). As shown in FIG. 2, the direction of current supplied by the current sources 210 and 212 to the node connecting the gates of the transistors 102 and 104 can be different. The magnitude of the currents supplied by the current sources 210 and 212 can be equal and opposite, but are not so limited.

The floating voltage source driver 204 can provide current to the circuit element 208 and the sensing component 206. When the switches 214 and 216 are operated to provide current Ion from the current source 210, a positive voltage drop can be provided across the circuit element 208 and the sensing component 206. In contrast, when the switches 214 and 216 are operated to deliver current Ioff from the current source 212, a negative voltage drop can be provided across the circuit element 208 and the sensing component 206. The bootstrapped switch circuit 200 can turn on when the voltage drop across the circuit element 208 and the sensing component 206 approximately exceeds a gate-to-source voltage Vgs needed to turn on the transistors 102 and 104. The bootstrapped switch circuit 200 can turn off when the voltage drop across the circuit element 208 and the sensing component 206 is approximately below the gate-to-source voltages Vgs needed to turn on the transistors 102 and 104 (e.g., if the voltage drop is a negative value).

Although FIG. 2 shows a single floating voltage source 202, a number of different floating voltage sources can be used to provide different voltages for each of the on and off modes of the bootstrapped switch circuit 200. Furthermore, multiple voltage sources 202 can be used to provide different voltages to the gates of the transistors 102 and 104. A first voltage source 202 can be used to activate transistor 102 and a second voltage source 202 can be used to active transistor 104. With such a configuration, the gates of the transistors 102 and 104 do not have to be coupled together. For example, a first voltage source 202, according to one of the embodiment of the present disclosure, can be coupled to the gate of transistor 102 and to the connected sources of transistors 102 and 104. A second voltage source 202 according to another embodiment of the present disclosure can be coupled to the gate of transistor 104 and to the connected sources of transistors 102 and 104. Such a configuration may provide different switching parameters for the transistors 102 and 104.

In one embodiment, one or more circuit elements (e.g., resistor) may be provided between the gates or the sources of the transistors 102 and 104 to produce different voltages to the transistors 102 and 104. The one or more voltage sources 202 can be coupled to one of the nodes between the gates or the sources of the transistors 102 and 104. For example, a first circuit element may be provided between the gate of transistor 102 and a terminal of the floating voltage source 202 and a second circuit element may be provided between the gate of transistor 104 and the terminal of the floating voltage source 202. Similarly, one or more circuit elements can be provided between the sources of the transistors 102 and 104 and a second terminal of the floating voltage source 202.

The floating voltage source driver 204 may include circuits that use a single current source to generate multiple currents having different magnitudes and/or directions of flow to the floating voltage source 202.

The floating voltage source driver 204 can be implemented to generate simple Ion and Ioff currents if an inexpensive solution is preferred. For example, the current Ion and the current Ioff can be delivered by a global bias block or a reference block. Alternatively, very precise bias currents Ion and Ioff can be generated in the floating voltage source driver 204 to provide advantages to the switch performance. For example, when generating the bias currents Ion and Ioff, the operation of the bootstrapped switch circuit and the floating voltage source 202 can be replicated in the floating voltage source driver 204. With these circuits, desired bootstrapped switch circuit performance can be obtained such that, for example, the on-resistance or the overdrive voltage can be constant over process and temperature variations.

Figure 4A:
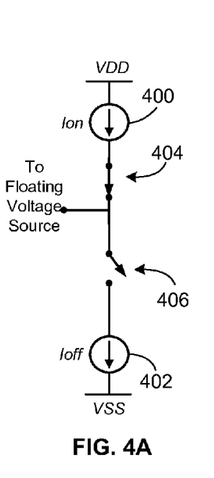
FIGS. 4A, 4B and 4C are circuit schematics depicting exemplary embodiments of current source circuits that can supply predetermined currents for the bootstrapped switch circuit depicted in FIG. 2.
Figure 4B:
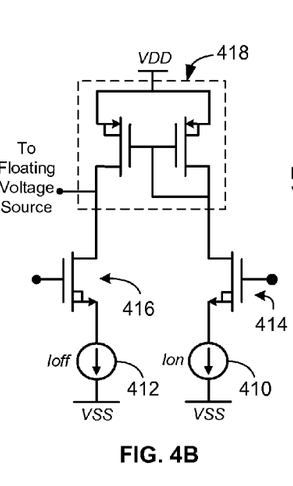
Figure 4C:
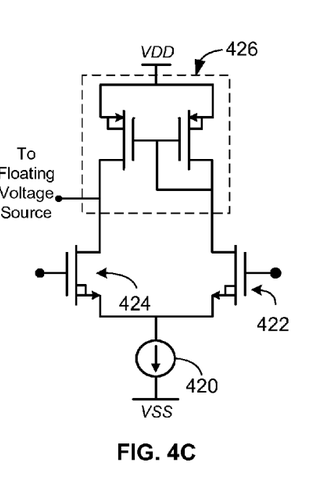

FIGS. 4A, 4B and 4C are circuit schematics depicting exemplary embodiments of current source circuits that can supply predetermined currents for the bootstrapped switch circuit depicted in FIG. 2. The current source circuits for supplying the predetermined currents can connect to any one of the nodes in the floating voltage source 202 or the nodes coupling the transistors 102 and 104 (not shown in FIGS. 4A, 4B and 4C). The current source circuits can provide one or more bias currents in response to a control signal. A first bias current (e.g., Ion) can contribute to the generation of a voltage drop across the floating voltage source 202 terminals that can be large enough to provide the sufficient gate-to-source voltage Vgs to turn on the bootstrapped switch circuit 200. A second bias current (e.g., Ioff) can contribute to the generation of a voltage drop across the floating voltage source 202 that does not exceed the threshold voltage of the transistors in the bootstrapped switch circuit 200. Bias current Ioff, for example, can generate a voltage drop across the floating voltage source 202 that is negative. The currents Ion and Ioff can provide currents that are equal and opposite but are not so limited.

FIG. 4A shows an embodiment in which current sources 400 and 402 provide currents Ion and Ioff, respectively, based on control signals operating switches 404 and 406. The two current sources 400 and 402 can be connected in series and the two switches 404 and 406 can be positioned between each of the current sources and coupled between a first supply voltage VDD and a second supply voltage VSS. The current sources 400 and 402 can provide the currents Ion and Ioff to a floating voltage source (not shown in FIG. 4A).

FIG. 4B shows an embodiment comprising a current source 410, a current source 412, a transistor 414, a transistor 416, and a current mirror circuit 418. The transistors 414 and 416 can be NMOS transistors, but are not so limited. The current sources 410 and 412 can provide currents Ion and Ioff, respectively, based on control signals operating the transistors 414 and 416. Thus, the transistors 414 and 416 can be current steering transistors that provide current in response to control signals. When the transistor 414 is supplied a control signal to provide a path for the current source 410, the PMOS transistors in the current-mirror circuit 418 can mirror the current Ion of the current source 410 into the node coupled to the floating voltage source (not shown in FIG. 4B). Current mirror 418 can be configured to produce a replica of the current Ion or a scaled version thereof (e.g., current Ion scaled by a fixed gain). Under this scenario, the current Ion can generate a voltage drop in the floating voltage source to turn the bootstrapped switch on. When the transistor 416 is supplied a control signal to provide a path for the current source 412, the current Ioff of the current source 412 can be supplied to the node coupled to the floating voltage source. Under this scenario the current Ioff can generate a voltage drop in the floating voltage source to turn the bootstrapped switch off.

FIG. 4C shows an embodiment comprising a current source 420, a transistor 422, a transistor 424, and a current mirror circuit 426. The transistors 420 and 422 can be NMOS transistors, but are not so limited. Current mirror 426 can be configured to produce a replica of the current Ion or a scaled version thereof (e.g., current Ion scaled by a fixed gain). In this embodiment, a single current source 420 can provide currents Ion and Ioff based on control signals operating the transistors 422 and 424. Thus, the transistors 422 and 424 can be current steering transistors that provide current in response to a control signal. Specifically, the current source 420 can supply two currents, each having the same approximate magnitude to the node coupled to the floating voltage source (not shown in FIG. 4C) but with different directions. Different magnitudes of current can be provided by current source 420 if the current source is configured to provide multiple current values.

In the embodiments shown in FIGS. 4B and 4C, the two control signals sent to the transistors 414 and 416 and to the transistors 422 and 424 can be replaced with a single control signal if, for example, a single control signal is sent to control the operation of the first transistor and an inverter is used to control the operation of the second transistor.

Figure 5:
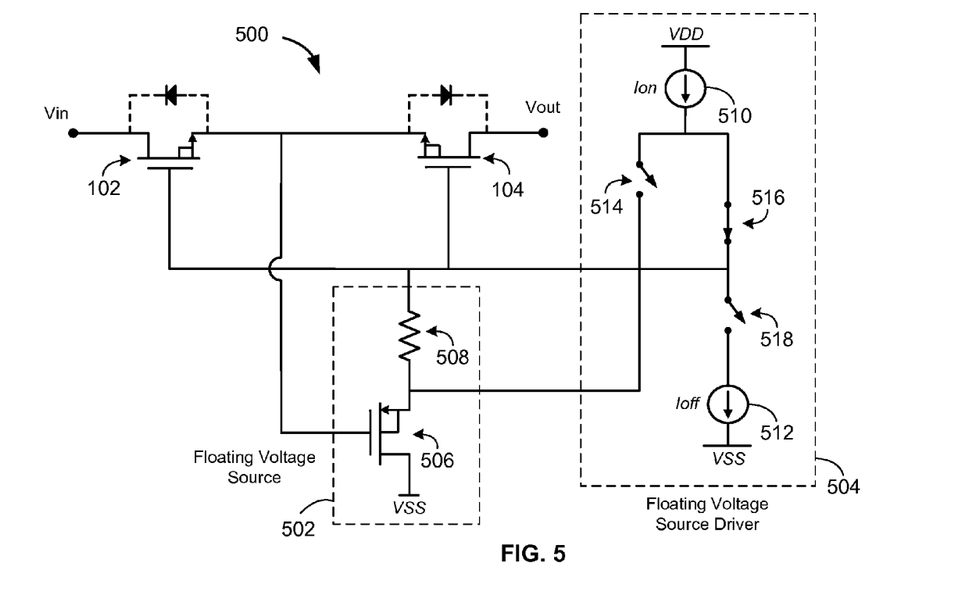
FIG. 5 is a circuit schematic depicting a second exemplary embodiment of a bootstrapped switch circuit having a floating voltage source and a floating voltage source driver.

FIG. 5 is a circuit schematic depicting a second exemplary embodiment of a bootstrapped switch circuit 500 having a floating voltage source 502 and a floating voltage source driver 504. The bootstrapped switch circuit 500 can include a transistor 102 and a transistor 104, which can be NMOS transistors, but are not so limited. The transistors 102 and 104 can have their gates coupled to each other and their sources coupled to each other, similar to FIG. 1. The floating voltage source 502 can include a transistor 506 and a resistor 508, but is not so limited. The transistor 506 can be a PMOS transistor, but is not so limited. The resistor 508 can be coupled to the source of the transistor 506 and to the gates of the transistors 102 and 104. The gate of the transistor 506 can be coupled to the sources of the transistors 102 and 104. The resistor 508 can be a bidirectional element that can provide a voltage drop. Further, as an example, the resistor 508 can be any one or a combination of resistors, diodes, diode connected NMOS or PMOS transistors and zener diodes.

The floating voltage source driver 504 can include a current source 510 providing current Ion and a current source 512 providing current Ioff. The floating voltage source driver 504 can include three switches 514, 516 and 518. The switches 514, 516 and 518 can control the supply of currents Ion and Ioff to the floating voltage source 502.

The floating voltage source driver 504 can supply currents to different nodes of the floating voltage source 502. For example, as shown in FIG. 5, the floating voltage source driver 504 can supply a current to the node connecting the gates of NMOS transistors 102 and 104 and the resistor 508, or can supply a current to the node connecting the resistor 508 and the source of the transistor 506.

To turn the bootstrapped switch circuit 500 on, the switch 516 can be turned on (i.e., closed) and the switches 514 and 518 can be turned off (i.e., open). Under this scenario, current Ion from the current source 510 can be provided to the node connecting the gates of the transistors 102 and 104 and the resistor 508. Accordingly, the current Ion from the current source 510 flowing into the resistor 508 can provide a voltage drop over the resistor 508 and a voltage can be generated between the source and the gate of the transistor 506. As a result, the voltage generated between the gate and source of the transistors 102 and 104 may approximately equal:

$$V_{GS\_102/104} = V_R + V_{SG\_506} \quad (1)$$

where $V_R$ is a voltage drop over the resistor 508 and $V_{SG\_506}$ is the voltage between the source and the gate of the transistor 506. The bootstrapped switch circuit 500 can be turned on when the voltage between the gate and source of the transistors 102 and 104 is greater than a threshold voltage of the transistors 102 and 104. The current source 510 can provide current Ion such that a voltage drop is provided across resistor 508 and the transistor 506 to generate the gate-to-source voltage of the transistors 102 and 104 that is approximately equal to or greater than the threshold voltage of the transistors 102 and 104.

To turn the bootstrapped switch circuit 500 off, the switch 516 can be turned off (i.e., open) and the switches 514 and 518 can be turned on (i.e., closed). Under this scenario, the current Ion from the current source 510 can be provided to the node connecting the source of the transistor 506 and the resistor 508. Under this scenario, a path can be provided for current Ioff from the node connecting the gates of the transistors 102 and 104 to the current source 512. Accordingly, current can flow from the current source 510 to the node connecting the resistor 508 and the source of the transistor 506, across the resistor 508 to the node connecting the gates of the transistors 102 and 104, and to the current source 512. In particular, from the node connecting the resistor 508 and the transistor 506, current Ion minus Ioff can flow across the transistor 506 and the current Ioff can flow across the resistor 508 to the node connecting the gates of the transistors 102 and 104. The voltage at the coupled gates of the transistors 102 and 104 may approximately equal:

$$V_{GS\_102,104} = -V_R + V_{SG\_506} \qquad (2)$$

The bootstrapped switch circuit 500 can be turned off when the voltage between the gate and source of the transistors 102 and 104 is less than the threshold voltage of the transistors 102 and 104. The current sources 510 and 512 can provide currents Ion and Ioff, respectively, such that a voltage drop is provided across resistor 508 and the transistor 506 to generate the voltage between the gate and source of the transistors 102 and 104 that is less than the threshold voltage of the transistors 102 and 104.

In contrast to the embodiment shown in FIG. 2, where the Ion and Ioff currents are provided to the same node, in the exemplary embodiment shown in FIG. 5, the floating voltage source driver 504 can supply current to different nodes of the floating voltage source 502. In addition, the bootstrapped switch circuit 500 of FIG. 5 can use both current sources to generate a desired voltage drop across resistor 508 to turn off the bootstrapped switch circuit 200.

Figure 6:
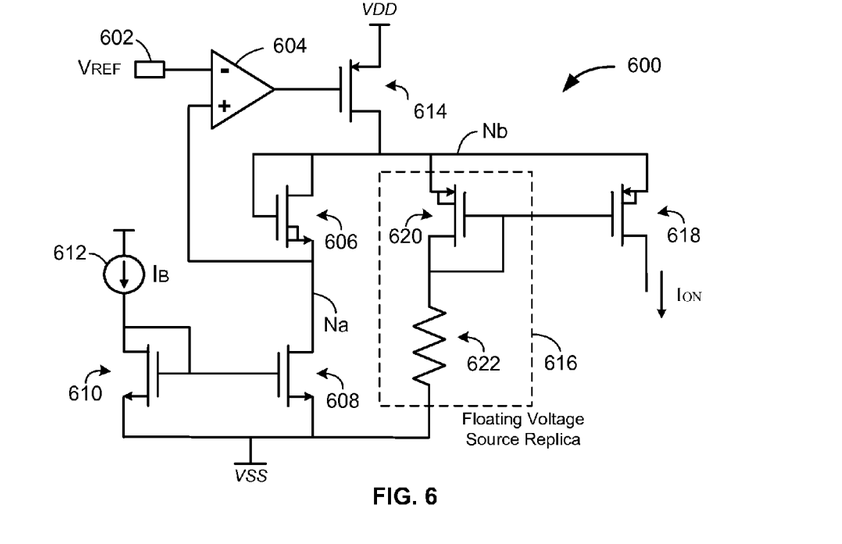
FIG. 6 is a circuit schematic depicting a first exemplary embodiment of a bias generator circuit that can be used to generate a constant overdrive voltage for a bootstrapped switch circuit.

FIG. 6 is a circuit schematic depicting a first exemplary embodiment of a bias generator circuit 600 that can be used to generate a constant overdrive voltage for a bootstrapped switch circuit. The bias generator circuit 600 can be, for example, coupled to the bootstrapped switch depicted in FIG. 1, 2 or 5. The constant overdrive voltage can be a portion of a voltage provided in excess of the threshold voltage that turns a transistor on. The overdrive voltage can be used to control certain parameters of the transistor. For example, the overdrive voltage can be used to control certain parameters of the transistors 102 and 104 in the bootstrapped switch circuit.

As shown in FIG. 6, the bias generator circuit 600 can include an input 602 receiving a reference voltage Vref, an amplifier 604, a transistor 606, a transistor 608, a transistor 610, a current source 612, a transistor 614, a floating voltage source replica circuit 616, and a transistor 618. The floating voltage source replica circuit 616 can include one or more circuit elements that are substantially identical to corresponding circuit elements in the floating voltage source (e.g., floating voltage source shown in FIG. 2). The floating voltage source replica circuit 616 may replicate the gate-to-source voltage supplied to the transistors in the bootstrapped switch circuit (e.g., circuit 200 shown in FIG. 2). The floating voltage source replica circuit 616 may include a PMOS transistor 620 and a resistor 622. The transistor 606 can be an NDMOS transistor, the transistors 608 and 610 can be NMOS transistors, and the transistors 614 and 618 can be PMOS transistors, but are not so limited.

Input 602 can receive voltage Vref from a voltage source and can provide voltage Vref to a first terminal (e.g., a negative input terminal) of the amplifier 604. A second terminal (e.g., a positive terminal) of the amplifier 604 can be coupled to the source of the NDMOS transistor 606 via node Na. The source of NDMOS transistor 606 can also be coupled to the drain of NMOS transistor 608 via node Na. The NMOS transistor 608 can be coupled to the NMOS transistor 610 via the gates of the transistors 608 and 610 to replicate current Ib provided by the current source 612 and supplied to the drain and the gate of the NMOS transistor 610. The gate of the NDMOS transistor 606 can be coupled to the drain of the NDMOS transistor 606 and to the drain of the PMOS transistor 614 via node Nb. The gate of the PMOS transistor 614 can be coupled to the output of the amplifier 604. The voltage source replica circuit 616 can be coupled to node Nb connecting the sources of the NDMOS transistor 606 and the PMOS transistor 614. The source of the PMOS transistor 618 can also be coupled to the node Nb connecting the sources of the NDMOS transistor 606 and the PMOS transistor 614. The resistor 622 in the floating voltage source replica circuit 616 can be coupled to the drain and the gate of the PMOS transistor 620. The gates of the PMOS transistor 620 and the PMOS transistor 618 can also be coupled together.

The bias generator circuit 600 can be configured to provide current Ion such that the overdrive voltage Vod provided to the bootstrapped switch circuit (not shown) is approximately constant over process and temperature variations. Overdrive voltage Vod can be approximately equal to the gate-to-source voltage Vgs minus the threshold voltage Vth of the transistor in the bootstrapped switch circuit. The voltage Vref supplied to the input 602 and the amplifier 604 can be selected so that it is approximately constant over process and temperature variations. The reference voltage Vref can approximately equal the overdrive voltage Vod of the switch device. The output of the amplifier 604 can drive PMOS transistor 614 such that a voltage of Vref appears on the node Na coupled to the source of the NDMOS transistor 256. The current source 612 can provide a bias current Ib that can be forced across the NDMOS transistor 606. The bias current Ib can be selected such that it is small enough to produce a small gate-to-source voltage Vgs in the NDMOS transistor 606. The low Vgs of the NDMOS transistor 606 can be similar to the threshold voltage Vth of the transistors in the bootstrapped switch circuit.

The voltage at the node Nb can be equal to the voltage at the node Na plus the voltage drop of the gate-to-source voltage Vgs across the NDMOS transistor 606. Because the voltage at the node Na can be Vref, the voltage at the node Nb can be approximately equal to:

$$V_{NB} = V_{REF} + V_{GS\_606} \qquad (3)$$

where $V_{REF}$ is the voltage supplied to the input 602 and $V_{GS\_606}$ is the gate-to-source voltage of the NDMOS transistor 606. The gate-to-source voltage Vgs of the NDMOS transistor 606 can be approximately equal to the threshold voltage Vth of the NDMOS transistor 606. Therefore, the voltage at the node Nb can approximately equal:

$$V_{NB} \approx V_{REF} + V_{TH\_606} \qquad (4)$$

where $V_{TH\_606}$ is the threshold voltage of the NDMOS transistor 606. The voltage Vnb at the node Nb can be converted into a bias current Ion to be supplied to a floating voltage source that can control a bootstrapped switch circuit. Thus, the voltage Vnb can be converted into a bias current Ion followed by a subsequent conversion from the bias current Ion into a voltage in the floating voltage source.

To convert a voltage Vnb at node Nb into a current Ion, the voltage Vnb can be forced across a replica of the floating voltage source device to generate a current Ion. The current Ion can be approximated by:

$$I_{ON} = \frac{V_{NB}}{R_{FLOATING\_SOURCE}} \approx \frac{V_{TH\_606} + V_{REF}}{R_{FLOATING\_SOURCE}} \quad (5)$$

where $V_{TH\_606}$ is the threshold voltage of the NDMOS transistor 606 and $R_{FLOATING\_SOURCE}$ is the resistance of the floating voltage source. $R_{FLOATING\_SOURCE}$ can be viewed as representing a resistance of the floating voltage source for purposes of illustration (that is, for purposes of describing an aspect of the present invention by way of the equations above). This resistance can correspond to the voltage applied to the floating voltage source divided by the current of the floating voltage source. Current Ion can also be represented by:

$$I_{ON} = \frac{V_{GS\_606} - V_{GS\_620} + V_{REF}}{R_{622}} \quad (6)$$

The current Ion generated by the floating voltage source driver can be provided to the floating voltage source (not shown) and the generated voltage in the floating voltage source can be approximated by:

$$V_{FLOATING\_SOURCE} = I_{ON} * R_{FLOATING\_SOURCE} = V_{NB} \approx V_{TH\_606} + V_{REF} \quad (7)$$

In turn, the gate-to-source voltage Vgs of the transistors in the bootstrapped switch circuit (not shown) can be approximated by:

$$V_{GS\_SW} = V_{TH\_SW} + V_{OD} = V_{FLOATING\_SOURCE} \approx V_{TH\_606} + V_{REF} \quad (8)$$

where $V_{TH\_SW}$ is the threshold voltage of the transistors 102 and 104 in the bootstrapped switch and $V_{OD}$ is the overdrive voltage.

From equation 8, it can be seen that the threshold voltage of $V_{TH\_SW}$ of the transistors 102 and 104 in the bootstrapped switch can track the threshold voltage Vth_606 of the NDMOS transistor 606 in the floating voltage source driver over process and temperature variations. Specifically, the gate-to-source voltage Vgs of the transistors in the bootstrapped switch circuit can be approximately equal to the threshold voltage Vth_606 of the NDMOS transistor 606 plus the voltage Vref applied to the floating voltage source driver at node 602 which can be approximately constant. Thus, the overdrive voltage Vod of the switch device can equal the reference voltage Vref applied to the floating voltage source driver at node 602. The overdrive voltage Vod provided by the bias generator circuit 600 can be process and temperature invariant. In turn, this can ensure the stability of switch characteristics during operation.

Figure 7:
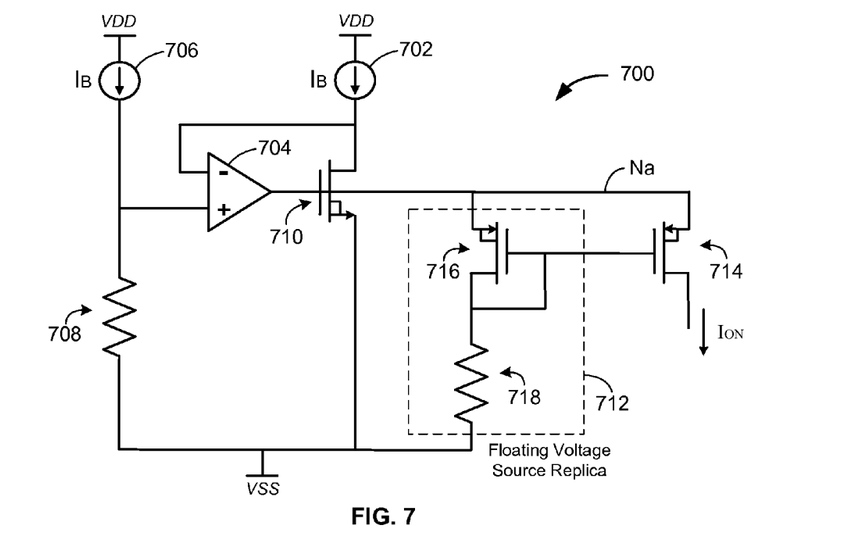
FIG. 7 is a circuit schematic depicting a first exemplary embodiment of a bias generator circuit that can be used to generate a constant on-resistance for components in a bootstrapped switch circuit.

FIG. 7 is a circuit schematic depicting a first exemplary embodiment of a bias generator circuit 700 that can be used to ensure that the components in the bootstrapped switch circuit exhibit a constant on-resistance. The bias generator circuit 700 can be configured to provide a bias current Ion such that a constant on-resistance over process and temperature variations can be maintained by the transistor components of the bootstrapped switch circuit (e.g., circuit 200 from FIG. 2).

The bias generator circuit 700 can include a current source 702, an amplifier 704, a current source 706, a precision resistor 708, a transistor 710, a floating voltage source replica circuit 712, and a transistor 714. The transistor 710 may be a NDMOS transistor and the transistor 714 may be a PMOS transistor, but are not so limited.

The floating voltage source replica circuit 712 can include one or more circuit elements that are substantially identical to corresponding circuit elements in the floating voltage source (e.g., floating voltage source shown in FIG. 2). The floating voltage source replica circuit 712 may replicate the gate-to-source voltage supplied to the transistors in the bootstrapped switch circuit (e.g., circuit 200 shown in FIG. 2). The floating voltage source replica circuit 712 can include a PMOS transistor 716 and a resistor 718.

The current source 702 can provide a bias current Ib to the node connecting a first terminal (e.g., a negative terminal) of the amplifier 704 and the drain of the NDMOS transistor 710. The current source 706 can provide the bias current Ib to the node connecting a second terminal (e.g., a positive terminal) of the amplifier 704 and the resistor 708. The resistor 708 can be a precision resistor or a combination of circuit elements providing a precise resistance. A precise resistance is a resistance that can be approximately constant over time and is approximately process and temperature invariant. The gate of the NDMOS transistor 710 can be coupled to the output of the amplifier 704. The gate of the NDMOS transistor can be coupled to the node Na connecting the floating voltage source replica circuit 712 and the source of the PMOS transistor 714. The source of the PMOS transistor 716 in the floating voltage source replica circuit 712 can be coupled to the node Na and the drain of the PMOS transistor 716 can be coupled to the resistor 718. The gate of the PMOS transistor 716 can be coupled to the gate of PMOS transistor 714 and the drain of the PMOS transistor 716.

The NDMOS transistor 710 can be selected such that it is an approximate replica of the transistors 102 and 104 used in the bootstrapped switch circuit (not shown). The amplifier 704 can drive the gate of the NDMOS transistor 710 such that, for the same bias current Ib, the voltage drop across the resistor 708 is forced across the drain-to-source of the NDMOS transistor 710. Accordingly, the resistance of the NDMOS transistor 710 can be the same as the resistance of resistor 708 over temperature and process variations. The gate-to-source voltage (Vgs) of the NDMOS transistor 710 may be the approximately equal to the gate-to-source voltage (Vgs_sw) of the transistors in the bootstrapped switch circuit, thereby allowing the same resistance as the resistance of the resistor 708.

The gate-to-source voltage (Vgs) of the NDMOS transistor 710 can be forced across the floating voltage source replica circuit 712, which can be similar to the floating voltage source that can be used to provide voltage to the bootstrapped switch circuit. The current supplied to the floating voltage source by the bias generator circuit 700 can be:

$$I_{ON} = \frac{V_{GS\_710}}{R_{FLOATING\_SOURCE}} \quad (9)$$

wherein $V_{GS\_710}$ is the gate-to-source voltage of the NDMOS transistor 710 and $R_{FLOATING\_SOURCE}$ is the resistance of the floating voltage source. The current Ion can be used by the floating voltage source to supply a floating voltage to the transistors of the bootstrapped switch circuit that can be approximated by:

$$V_{FLOATING\_SOURCE} = I_{ON} * R_{FLOATING\_SOURCE} = V_{GS\_710} \quad (10)$$

Because the floating voltage source applies the floating voltage between the gates and the sources of the transistors in the bootstrapped switch, the gate-to-source voltage of the transistors can be approximated by:

$$V_{GS\_SW} = V_{FLOATING\_SOURCE} = V_{GS\_710} \quad (11)$$

Accordingly, the gate-to-source voltage (Vgs_sw) of the transistors in the bootstrapped switch can be approximated by the gate-to-source voltage (Vgs) of the NDMOS transistor 710. With such a configuration, the transistors in the bootstrapped switch can exhibit an on-resistance similar to the resistance of the precision resistor 708 which is approximately constant over process and temperature variations. Maintaining an on-resistance that is approximately constant over process and temperature variations may allow the characteristics of the transistors 102 and 104 due the on-resistance to be approximately constant.

Figure 8:
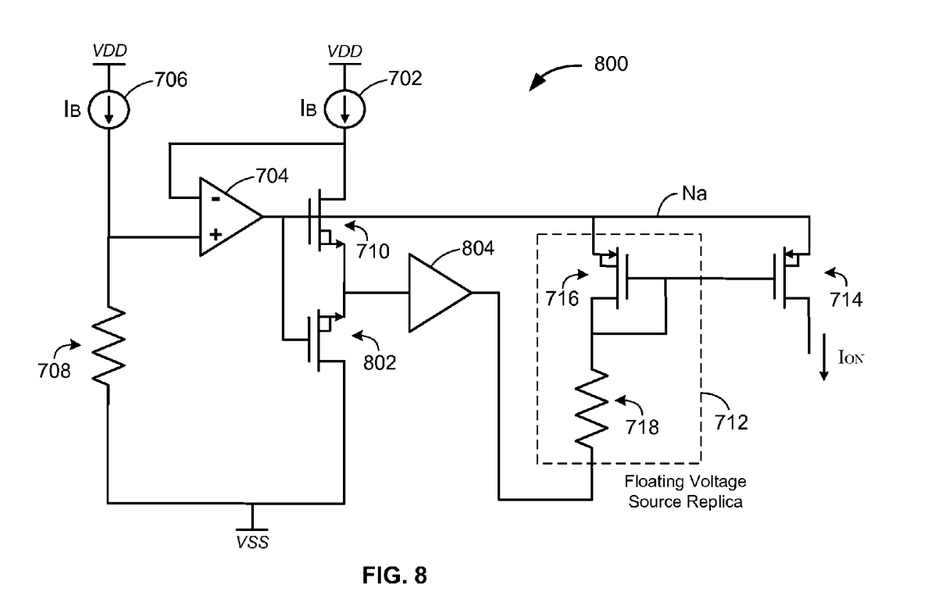
FIG. 8 is a circuit schematic depicting a second exemplary embodiment of a bias generator circuit that can be used to generate a constant on-resistance for components in a bootstrapped switch circuit.

FIG. 8 is a circuit schematic depicting a second exemplary embodiment of a bias generator circuit 800 that can be used to generate a constant transistor on-resistance for a bootstrapped switch circuit. The bias generator circuit 800 is similar to the bias generator circuit 700, shown in FIG. 7. In addition to the elements shown in FIG. 7, the bias generator circuit 800 can include a transistor 802 and a sensing component 804. The sensing component 804 can be a unity gain buffer, but is not so limited. The transistor 802 can be an NDMOS transistor, but is not so limited.

In the bias generator circuit 800, the transistors 710 and 802 can be used to replicate the gate-to-source voltage supplied to the transistors in the bootstrapped switch circuit (e.g., circuit 200 shown in FIG. 2) while maintaining a constant transistor on-resistance over process and temperature variations. The transistor 710 and the transistor 802 can provide an improved matching to the transistors in the bootstrapped switch circuit. In the exemplary embodiment, the gate of the NDMOS transistor 710 and the gate of the NDMOS transistor 802 can be coupled together. Similarly, the source of the NDMOS transistor 710 and the source of the NDMOS transistor 802 can be coupled together. The gate-to-source voltage (Vgs) of the NDMOS transistors 710 and 802 can be forced across the floating voltage source replica circuit 712. The floating voltage source replica circuit 712 can generate a current Ion that can be provided to a floating voltage source. Using the current Ion, the floating voltage source can apply the floating voltage between the gates and the sources of the transistors 102 and 104 in the bootstrapped switch circuit such that an approximately constant on-resistance over process and temperature variations is provided across transistors 102 and 104. As a result, switch performance can be improved or maintained during operation.

Figure 9:
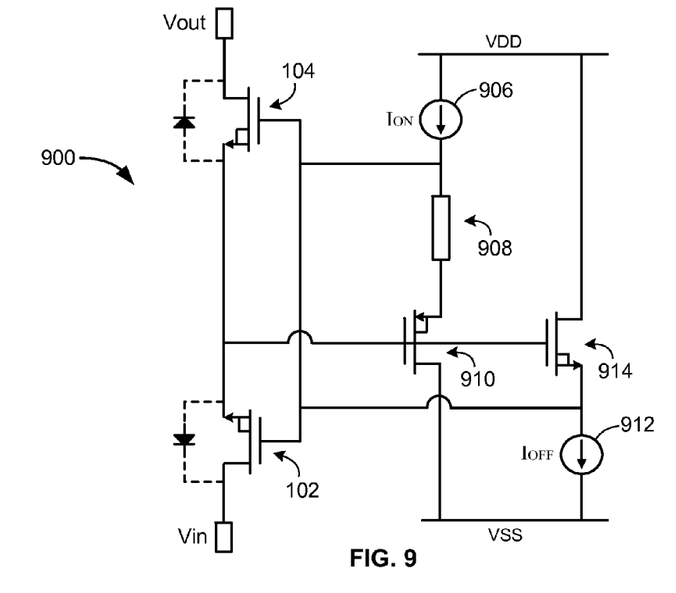
FIG. 9 is a circuit schematic depicting a first exemplary embodiment of a bootstrapped switch circuit having a control circuit that can handle fast switching.

FIG. 9 is a circuit schematic depicting a first exemplary embodiment of a bootstrapped switch circuit 900 having a control circuit that can handle fast switching. The bootstrapped switch circuit 900 can include a transistor 102, a transistor 104, a current source 906, a circuit element 908, a transistor 910, a current source 912, and a transistor 914. The gates of the transistor 102 and the transistor 104 may be coupled to each other. Similarly, the sources of the transistor 102 and the transistor 104 can be coupled to each other. The transistors 102, 104 and 914 can be NMOS transistors and the transistor 910 can be a PMOS transistor, but are not so limited.

The current source 906 can be coupled between the node connecting the gates of the transistors 102 and 104 and a first supply voltage VDD. The circuit element 908 can be coupled to the node connecting the gates of the transistors 102 and 104 and the source of the transistor 910. The drain of the transistor 910 can be coupled to a second supply voltage VSS. The gates of the transistors 910 and 914 can be coupled to the node connecting the sources of the transistors 102 and 104. The drain of the transistor 914 can be coupled to the first supply voltage VDD and the source of the transistor 914 can be coupled to the node connecting the sources of the transistors 102 and 104. The current source 912 can be coupled between the node connecting the sources of the transistors 102 and 104 and the second supply voltage VSS.

Using the current source 906, the circuit element 908, the transistors 910 and 914, and the current source 912, a voltage can be generated across the connected gates and the connected sources of the transistors 102 and 104 to control when the transistors 102 and 104 in the bootstrapped switch circuit are on and when they are off. To turn on transistors 102 and 104, current source 906 can provide a current Ion to generate voltage (Vr) across the circuit element 908 and a source-to-gate voltage (Vgs) of the PMOS transistor 910. The voltage across the circuit element 908 and the PMOS transistor 910 can generate a gate-to-source voltage (Vgs) in the NMOS transistors 102 and 104 that is approximately equal to:

$$V_{GS} V_R + V_{GS\_910} \quad (12)$$

where $V_R$ is the voltage across the resistor and $V_{GS\_910}$ is the gate-to-source voltage of the PMOS transistor 910. When the current source 906 provides the current Ion, the NMOS transistor 914 can see a negative voltage (Vgs) at the node coupled to the gate of the NMOS transistor 914 and therefore is off.

To turn off the NMOS transistors 102 and 104 in the bootstrapped switch circuit, the current source 912 can provide current Ioff which flows though the NMOS transistor 914. The gate-to-source voltage (Vgs) of the NMOS transistors 102 and 104 can be approximately equal to the negative gate-to-source voltage (Vgs_914) of NMOS transistor 914. Thus, the gate-to-source voltage Vgs of NMOS transistors 102 and 104 can approximately be:

$$V_{GS} = -V_{GS\_914} \quad (13)$$

where $V_{GS\_914}$ is the gate-to-source voltage of the NMOS transistor 914.

The circuit element 908 in the bootstrapped switch circuit 900 can be any one or a combination of resistors, diodes, diode connected NMOS or PMOS transistors and zener diodes. The circuit element 908 in the bootstrapped switch circuit 900 does not need to be a bidirectional circuit element. For example, the circuit element 908 can be a directional resistor or a diode. The circuit element 908 can include one or more diodes or a diode connected device to provide a fast turn-on and turn-off.

The bootstrapped switch circuit 900, shown in FIG. 9, allows for a fast turn-on and turn-off because the PMOS transistor 910 and the NMOS transistor 914 can withstand a relatively high current without causing a high voltage drop across the PMOS transistor 910 and the NMOS transistor 914. Thus, high currents can be provided for faster turn on and/or turn off of the transistors 102 and 104 in the bootstrapped switch circuit. After the turn on and/or turn off, the current can be reduced to save power.

Figure 10:
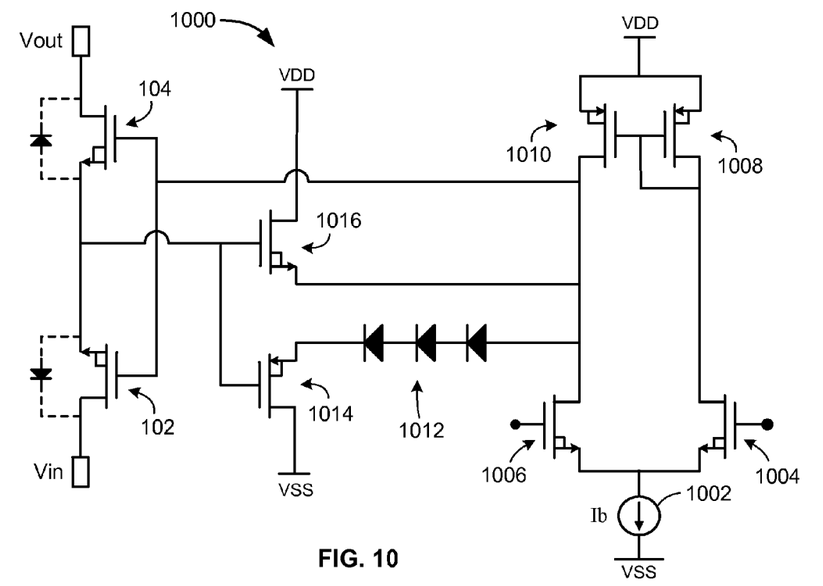
FIG. 10 is a circuit schematic depicting a second exemplary embodiment of a bootstrapped switch circuit having a control circuit that can handle fast switching.

FIG. 10 is a circuit schematic depicting a second exemplary embodiment of a bootstrapped switch circuit 1000 having a control circuit that can handle fast switching. The bootstrapped switch circuit 1000 can include transistors 102 and 104, a current source 1002, NMOS transistors 1004 and 1006, a current mirror circuit formed by PMOS transistors 1008 and 1010, one or more diodes 1012, a transistor 1014 and a transistor 1016. The gates of the transistors 102 and 104 can be coupled together. Similarly, the sources of the transistors 102 and 104 can be coupled together. The transistors 102, 104 and 1016 can be NMOS transistors and the transistor 1014 can be a PMOS transistor, but are not so limited.

To turn on and off the bootstrapped switch circuit 1000, control signals can be applied to the gates of the NMOS transistors 1004 and 1006. To turn on the transistors 102 and 104 in the bootstrapped switch circuit 1000, a relatively high signal can be applied to the gate of the NMOS transistor 1004 and a relatively low signal can be applied to the gate of the NMOS transistor 1006. When the NMOS transistor 1004 is on, current Ib can flow through the NMOS transistor 1004 and the PMOS transistor 1008. The current mirror formed by the PMOS transistors 1008 and 1010 may be configured to inject current Ib into the node connecting the diodes 1012 and the source of the NMOS transistor 1016. Current Ib can then flow through the diodes 1012 and the follower formed by the PMOS transistor 1014. A voltage drop can occur across the diodes 1012 and across the source and gate of the PMOS transistor 1014. The sum of these voltage drops can be applied across the source and gate of the transistors 102 and 104. Specifically, the gate-to-source voltage of the transistors 102 and 104 of the bootstrapped switch circuit 1000 caused by the diodes 1012 and the PMOS transistor 1014 can be approximated by:

$$V_{GS} = V_{GS\_1014} + V_{D1} + V_{D2} + V_{D3} \quad (14)$$

where $V_{D1}$, $V_{D2}$ and $V_{D3}$ are the voltages across the diodes 1012 and $V_{GS\_1014}$ is the gate-to-source voltage of the PMOS transistor 1014. When the gate-to-source voltage Vgs of the transistors 102 and 104 exceeds the threshold voltage of the transistors 102 and 104, the transistors 102 and 104 may be on and the bootstrapped switch circuit 1000 may conduct the signals applied to the input of the bootstrapped switch circuit 1000. When bias current Ib is supplied to turn the bootstrapped switch circuit 1000 on, the NMOS transistor 1016 can be turned off because it sees a negative voltage Vgs.

To turn off the transistors 102 and 104 in the bootstrapped switch circuit 1000, a relatively low signal can be applied to the gate of the NMOS transistor 1004 and a relatively high signal can be applied to the gate of the NMOS transistor 1006. When the NMOS transistor 1006 is on, current Ib may flow through the NMOS transistor 1006 and the PMOS transistor 1016. When the bias current Ib is applied across the PMOS transistor 1016, the gate-to-source voltage Vgs of the NMOS transistors 102 and 104 may be equal to the opposite of the gate-to-source voltage of the PMOS transistor 1016. Thus, a negative voltage can be provided at the gate-to-source of the transistors 102 and 104 to turn off the bootstrapped switch circuit 1000. When the NMOS transistor 1016 is conducting bias current Ib, the diodes 1012 can be reversed biased.

Similar to the first exemplary embodiment shown in FIG. 9, the bootstrapped switch circuit 1000 can allow for a faster turn-on and turn-off because the follower connected device formed by the PMOS transistor 1014, the NMOS transistor 1016 and the diodes 1012 can withstand high current without causing a high voltage drop across these devices. Thus, high current can be provided for a faster turn on and/or turn off. After the turn on and/or turn off, the current can be reduced to save power.

The diodes 1012 used to form a voltage drop can be replaced with other elements that can be configured to provide the desired voltage drop. For example, a resistor or a combination of resistors and diodes could be used in place of the diodes 1012.

The bias current supplied using the control circuit formed with the transistors 1004 and 1006 and the current mirror circuit formed with the transistors 1008 and 1010, can be supplied with other circuits. Examples of these circuits include the exemplary circuits shown in FIGS. 4A, 4B and 4C.

As will be understood by one skilled in the pertinent arts, the switch configurations described herein are not limited to the specific transistors depicted but are applicable to various transistor technologies including NMOS, PMOS, NDMOS and PDMOS transistors. Furthermore, in the above embodiments a diode can be any one or a combination of resistors, diodes, diode connected transistor (e.g., a diode connected bipolar device such as an NPN or PNP transistor) and zener diodes.

Although the embodiments explained are made with reference to a bootstrapped switch circuit, it is to be understood that the exemplary embodiments can be applied to other types of switches having one or more transistors.

While various aspects of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

We claim:

1. A bootstrapped switch circuit, comprising:
a first switch transistor to receive an input signal;
a second switch transistor to provide an output signal, wherein a source of the second switch transistor is coupled to a source of the first switch transistor;
a voltage source coupled to at least one of a gate of the first switch transistor and a cote of the second switch transistor and coupled to the sources of the first and second switch transistors, wherein the voltage source generates a control voltage to activate at least one of the first and second switch transistors based on a received bias current; and
a voltage source driver coupled to the voltage source, wherein the voltage source driver generates the bias current based on a bias voltage, the bias voltage comprising a first voltage approximately corresponding to an overdrive voltage of at least one of the first and second switch transistors and a second voltage approximately corresponding to a threshold voltage of at least one of the first and second switch transistors,
wherein the voltage source includes:
a sensing element coupled to the sources of the first and second switch transistors, and
a circuit element coupled between the sensing element and at least one of the gates of the first and second switch transistors,
wherein a voltage drop generated over the circuit element and the sensing element due to the bias current substantially corresponds to the control voltage.

2. The bootstrapped switch circuit of claim 1, wherein:
the sensing element is a transistor,
the circuit element includes a resistor coupled to a source of the transistor, and
a gate of the transistor is coupled to the coupled sources of the first and second switch transistors.

3. A bootstrapped switch circuit, comprising:
a first switch transistor to receive an input signal;

a second switch transistor to provide an output signal, wherein a source of the second switch transistor is coupled to a source of the first switch transistor;

a voltage source coupled to at least one of a gate of the first switch transistor and a cote of the second switch transistor and coupled to the sources of the first and second switch transistors, wherein the voltage source generates a control voltage to activate at least one of the first and second switch transistors based on a received bias current; and a voltage source driver coupled to the voltage source, wherein the voltage source driver generates the bias current based on a bias voltage, the bias voltage comprising a first voltage approximately corresponding to an overdrive voltage of at least one of the first and second switch transistors and a second voltage approximately corresponding to a threshold voltage of at least one of the first and second switch transistors, wherein the voltage source driver includes:

a voltage source transistor, wherein a gate-to-source voltage of the voltage source transistor approximately corresponds to the second voltage, an amplifier receiving the first voltage and providing the first voltage at a node connected to a source of the voltage source transistor, and a floating voltage source replica circuit coupled to a node connecting a drain and a gate of the voltage source transistor, to receive a sum of the first voltage and the second voltage and to convert the bias voltage into a bias current.

4. A bootstrapped switch circuit, comprising:

a first switch transistor to receive an input signal;

a second switch transistor to provide an output signal, wherein a source of the second switch transistor is coupled to a source of the first switch transistor;

a voltage source coupled to at least one of a gate of the first switch transistor and a cote of the second switch transistor and coupled to the sources of the first and second switch transistors, wherein the voltage source generates a control voltage to activate at least one of the first and second switch transistors based on a received bias current; and a voltage source driver coupled to the voltage source, wherein the voltage source driver generates the bias current based on a bias voltage, the bias voltage is generated by applying a current to a circuit element having an approximately constant resistance and the bias voltage approximately corresponding to the control voltage used to activate at least one of the first and second switch transistors, wherein the voltage source driver comprises a first voltage source transistor and a second voltage source transistor having gates coupled and sources coupled, wherein gate-to-source voltages of the first and second voltage source transistors approximately correspond to the bias voltage.

5. The bootstrapped switch circuit of claim 4, wherein the first and second voltage source transistors are of a same type as the first and second switch transistors.

6. A bootstrapped switch circuit, comprising:

a first switch transistor to receive an input signal;

a second switch transistor to provide an output signal, wherein a source of the second switch transistor is coupled to a source of the first switch transistor;

a voltage source coupled to at least one of a gate of the first switch transistor and a cote of the second switch transistor and coupled to the sources of the first and second switch transistors, wherein the voltage source generates a control voltage to activate at least one of the first and second switch transistors based on a received bias current; and a voltage source driver coupled to the voltage source, wherein the voltage source driver generates the bias current based on a bias voltage, the bias voltage is generated by applying a current to a circuit element having an approximately constant resistance and the bias voltage approximately corresponding to the control voltage used to activate at least one of the first and second switch transistors, wherein the voltage source driver includes:

a voltage source transistor, wherein a gate-to-source voltage of the voltage source transistor approximately corresponds to the bias voltage, a voltage source replica circuit that includes one or more replica circuit elements that are substantially identical to corresponding circuit elements of the voltage source, the voltage source replica circuit is coupled to a gate of the voltage source transistor, and the voltage source replica circuit converts the bias voltage into the bias current, and an amplifier to drive the gate of the voltage source transistor such that a voltage drop across the one or more replica circuit elements is forced across the drain and a source of the voltage source transistor.

7. A bootstrapped switch circuit, comprising:

a first switch transistor to receive an input signal;

a second switch transistor to provide an output signal, wherein a source of the second switch transistor coupled to a source of the first switch transistor;

a voltage source coupled to at least one of a gate of the first switch transistor and a cote of the second switch transistor and coupled to the sources of the first and second switch transistors, wherein the voltage source generates a first control voltage to turn on at least one of the first and second switch transistors by summing a gate-to-source voltage of a first transistor and a voltage across a circuit element when a first bias current is applied to the first transistor and the circuit element, and wherein the voltage source generates a second control voltage to turn off at least one of the first and second switch transistors, the second control voltage corresponding approximately to a negative value of a gate-to-source voltage of a second transistor that is generated when a second bias current is applied to the second transistor, wherein the gates of the first and second transistors are coupled to the sources of the first and second switch transistors, a first terminal of the circuit element is coupled to a source of the first transistor and a second terminal of the circuit element is coupled to at least one of the gates of the first and second switch transistors, the second terminal of the circuit element receives the first bias current, and the source of the second transistor receives the second bias current.

* * * * *

UNITED STATES PATENT AND TRADEMARK OFFICE
CERTIFICATE OF CORRECTION

| | |
|---|---|
| PATENT NO. | : 8,604,862 B2 |
| APPLICATION NO. | : 13/546802 |
| DATED | : December 10, 2013 |
| INVENTOR(S) | : Birk et al. |

Page 1 of 1

It is certified that error appears in the above-identified patent and that said Letters Patent is hereby corrected as shown below:

In the Claims

In column 16, line 37, change "a cote" to --a gate--

In column 17, line 5, change "a cote" to --a gate--

In column 17, line 38, change "a cote" to --a gate--

In column 18, line 5, change "a cote" to --a gate--

In column 18, line 38, change "a cote" to --a gate--

Signed and Sealed this
Twenty-ninth Day of September, 2015

Michelle K. Lee
*Director of the United States Patent and Trademark Office*